(12) United States Patent
Stephani et al.

(10) Patent No.: US 8,264,862 B2
(45) Date of Patent: Sep. 11, 2012

(54) LOW POWER SRAM BASED CONTENT ADDRESSABLE MEMORY

(75) Inventors: Richard J. Stephani, St. Paul, MN (US); Gordon W. Priebe, Champlin, MN (US)

(73) Assignee: LSI Corporation, Milpitas, CA (US)

( * ) Notice: Subject to any disclaimer, the term of this patent is extended or adjusted under 35 U.S.C. 154(b) by 23 days.

(21) Appl. No.: 12/953,759

(22) Filed: Nov. 24, 2010

(65) Prior Publication Data

US 2012/0127772 A1    May 24, 2012

(51) Int. Cl.
*G11C 15/04* (2006.01)

(52) U.S. Cl. ............ 365/49.17; 365/49.11; 365/49.1; 365/156; 365/227

(58) Field of Classification Search ............ 365/49.11, 365/49.15, 49.17, 49.1, 227, 226, 156, 154
See application file for complete search history.

(56) References Cited

U.S. PATENT DOCUMENTS

| | | | |
|---|---|---|---|
| 4,962,487 A | 10/1990 | Suzuki | 365/233.5 |
| 6,128,207 A | 10/2000 | Lien et al. | 365/49 |
| 6,862,238 B1 * | 3/2005 | Lee | 365/222 |
| 6,977,831 B2 | 12/2005 | Hatsch et al. | 365/49 |
| 7,227,765 B2 * | 6/2007 | De Sandre et al. | 365/49.15 |

* cited by examiner

*Primary Examiner* — Andrew Q Tran
(74) *Attorney, Agent, or Firm* — Christopher P. Maiorana, PC

(57) ABSTRACT

An apparatus comprising a memory array and a plurality of processing circuits. The memory array may be configured to store a plurality of data bits in a plurality of rows and a plurality of columns. A plurality of data words may be stored in a respective plurality of the columns. The plurality of processing circuits may each be configured to compare (i) a test bit of a plurality of bits of an input data word with (ii) a test bit of one of the plurality of columns to determine a match. The compare may occur on a first clock cycle of an input clock signal. Each of the plurality of processing circuits may be configured to power down a respective column of the memory array if the test bit of the input data word does not match the test bit of the column.

19 Claims, 5 Drawing Sheets

| ADDRESS | DATA WORDS | | | | | | | |
|---|---|---|---|---|---|---|---|---|
| Y-1 | F[X-1] | F[X-2] | . | . | . | F[3] | F[2] | F[1] | F[0] |
| Y-2 | E[X-1] | E[X-2] | . | . | . | E[3] | E[2] | E[1] | E[0] |
| . | | | | | | | | |
| . | | | | | | | | |
| . | | | | | | | | |
| 3 | D[X-1] | D[X-2] | . | . | . | D[3] | D[2] | D[1] | D[0] |
| 2 | C[X-1] | C[X-2] | . | . | . | C[3] | C[2] | C[1] | C[0] |
| 1 | B[X-1] | B[X-2] | . | . | . | B[3] | B[2] | B[1] | B[0] |
| 0 | A[X-1] | A[X-2] | . | . | . | A[3] | A[2] | A[1] | A[0] |

TYPICAL MEMORY STORAGE SCHEME.

FIG. 3

| ADDRESS | DATA WORDS | | | | | | | |
|---|---|---|---|---|---|---|---|---|
| Y-1 | F[X-1] | E[X-1] | | | | D[X-1] | C[X-1] | B[X-1] | A[X-1] |
| Y-2 | F[X-2] | E[X-2] | | | | D[X-2] | C[X-2] | B[X-2] | A[X-2] |
| . | . | . | | | | . | . | . | . |
| . | . | . | | | | . | . | . | . |
| . | . | . | | | | . | . | . | . |
| 3 | F[3] | E[3] | | | | D[3] | C[3] | B[3] | A[3] |
| 2 | F[2] | E[2] | | | | D[2] | C[2] | B[2] | A[2] |
| 1 | F[1] | E[1] | | | | D[1] | C[1] | B[1] | A[1] |
| 0 | F[0] | E[0] | | | | D[0] | C[0] | B[0] | A[0] |

STORAGE SCHEME FOR SINGLE BIT COMPARISON.

FIG. 4

LOW POWER SRAM BASED CONTENT ADDRESSABLE MEMORY

FIELD OF THE INVENTION

The present invention relates to memory devices generally and, more particularly, to a method and/or apparatus for implementing a low power SRAM based content addressable memory.

BACKGROUND OF THE INVENTION

Conventional content addressable memories (CAMs) compare an input data word with all the words stored in the CAM. All of the stored words are simultaneously compared to the input data word over a few clock cycles. Because of the amount of computation that is done in parallel, CAM memories usually have very high peak current and high average power specifications. Relative to a CAM, an SRAM memory has much lower peak current and average power specifications. In addition, SRAM clock frequencies are usually higher than a comparable CAM.

It would be desirable to implement a memory that reduces peak current and average power, reduces area, and/or increases throughput (clock frequency) by implementing an SRAM with storage configuration and comparison circuitry.

SUMMARY OF THE INVENTION

The present invention concerns an apparatus comprising a memory array and a plurality of processing circuits. The memory array may be configured to store a plurality of data bits in a plurality of rows and a plurality of columns. A plurality of data words may be stored in a respective plurality of the columns. The plurality of processing circuits may each be configured to compare (i) a test bit of a plurality of bits of an input data word with (ii) a test bit of one of the plurality of columns to determine a match. The compare may occur on a first clock cycle of an input clock signal. Each of the plurality of processing circuits may be configured to power down a respective column of the memory array if the test bit of the input data word does not match the test bit of said column.

The objects, features and advantages of the present invention include providing a content addressable memory that may (i) be implemented in an SRAM, (ii) be implemented in a low power memory, (iii) provide power down of one or more columns, (iv) provide power down of all of the memory, (v) reduce peak and/or average power, (vi) increase throughout and/or (vii) increase the operating frequency of the memory.

BRIEF DESCRIPTION OF THE DRAWINGS

These and other objects, features and advantages of the present invention will be apparent from the following detailed description and the appended claims and drawings in which:

FIG. 3 is a table illustrating how words are stored in a typical SRAM;

FIG. 4 is a table illustrating how each bit of a data word is stored at a different address;

DETAILED DESCRIPTION OF THE PREFERRED EMBODIMENTS

Figure 1:
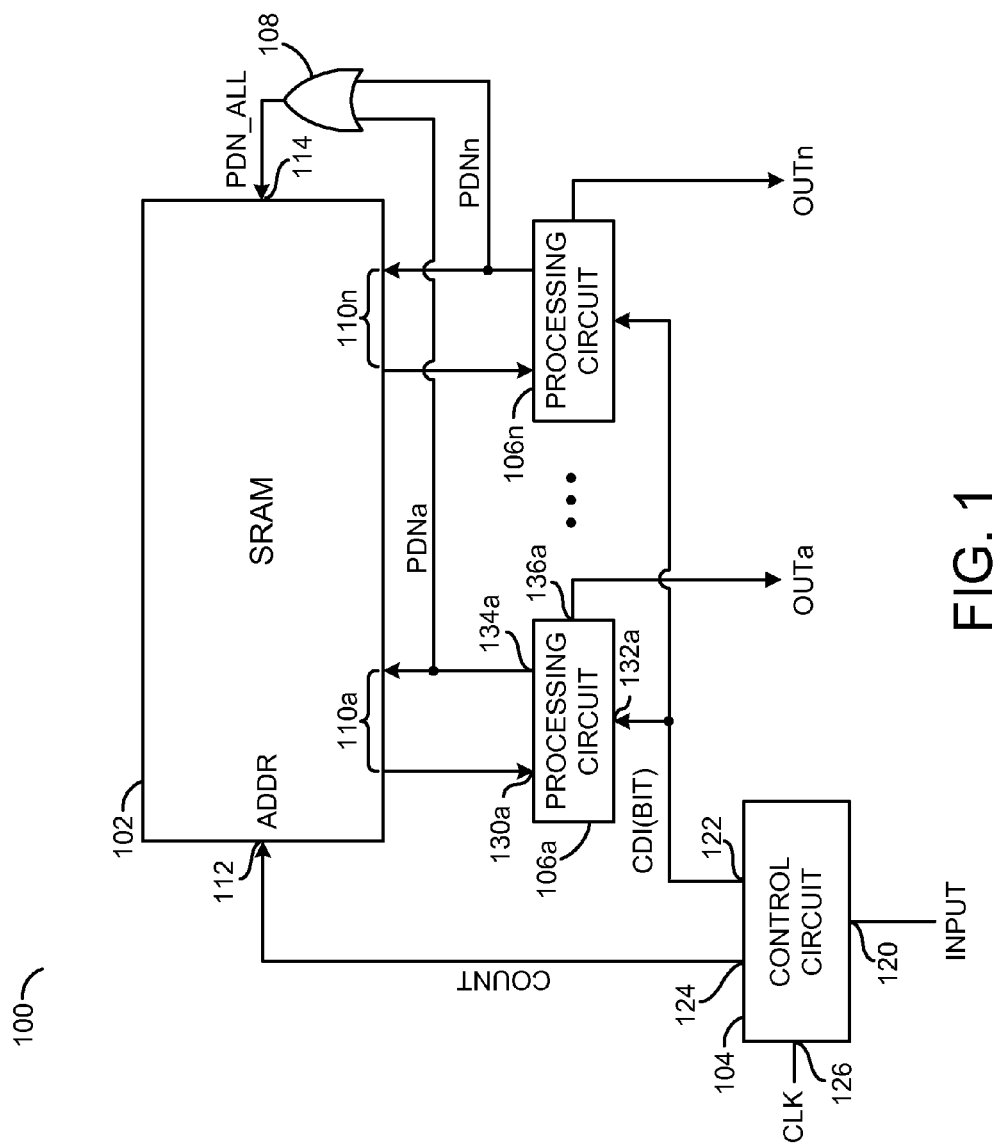
FIG. 1 is a diagram of the present invention.

Referring to FIG. 1, a block diagram of a circuit 100 is shown in accordance with an embodiment of the present invention. The circuit 100 generally comprises a block (or circuit) 102, a block (or circuit) 104, a plurality of blocks (or circuits) 106a-106n, and a block (or circuit) 108. The circuit 102 may be implemented as a SRAM memory. In one example, the circuit 102 may be implemented as a low power SRAM memory. The circuit 104 may be implemented as a control circuit. The circuits 106a-106n may be implemented as processing circuits. The circuit 108 may be implemented as a gate, such as logical OR gate.

The memory circuit 102 generally comprises a number of input/outputs 110a-110n, an input 112, and an input 114. The input 112 may be an address input. For example, the input 112 may receive a signal (e.g., COUNT) that may determine which address of the memory 102 is accessed. The input 114 may be implemented as an enable input. For example, the input 114 may receive a signal (e.g., PDN_ALL) that enables the memory 102. The memory 102 may be configured in a row by column configuration. A number of digital words may be stored at a number of address locations (to be described in more detail in connection with FIGS. 4 and 5).

The control circuit 104 may have an input 120 that may receive a signal (e.g., INPUT). The signal INPUT may be a digital word having a particular width. The circuit 104 may also have an output 122, an output 124 and an input 126. The output 122 may present a signal (e.g., CDI). The signal CDI may represent one bit of the signal INPUT. The signal CDI may be presented to the processing circuits 106a-106n. The signal CDI may change on each clock cycle of a clock signal (e.g., CLK) received at the input 126. The output 124 may present the signal COUNT. The signal COUNT may sequentially progress through a number of addresses presented to the input 112. In one example, the signal COUNT may be timed by the signal CLK. The signal CLK may be a clock signal configured to oscillate at a predetermined frequency.

The processor circuit 106a may have an input 130a that may receive a particular bit from a particular column of information stored in the memory 102. The processing circuit 106a may also have an input 132a that may receive the signal CDI, an output 134a that may present a signal (e.g., PDNa) and an output 136a that may present a signal (e.g., OUTa). The processing circuit 106n may have similar inputs and outputs as the processing circuit 106a. The signals PDNa-PDNn may be used to power down a respective column of the memory 102. Powering down a particular column of the memory 102 may reduce dynamic and/or static leakage current.

The circuit 100 may perform CAM functions using the SRAM memory 102. The circuit 100 may store words in the memory 102 in an order that may facilitate a CAM like operation. In one example, the processing circuits 106a-106n may be implemented externally to the SRAM memory 102. In another example, the processing circuits 106a-106n may be implemented on the same die as the memory 102. The processing circuits 106a-106n may be implemented to reduce leakage current by generating the power down signals PDNa-PDNn based on a compare logic implemented for each of the input/outputs 110a-110n. The signal PDN_ALL may be a memory enable signal generated based on the compare results for all of the input/outputs 110a-110n. In general, the signal PDN_ALL is asserted when all of the power down signals PDNa-PDNn are asserted. If all of the columns are powered down, the entire memory 102 may be powered down. While the circuit 108 is shown as an OR gate, the particular type of gate, and/or the polarity of the signal PDN_ALL may be varied to meet the design criteria of a particular implementation.

Figure 2:
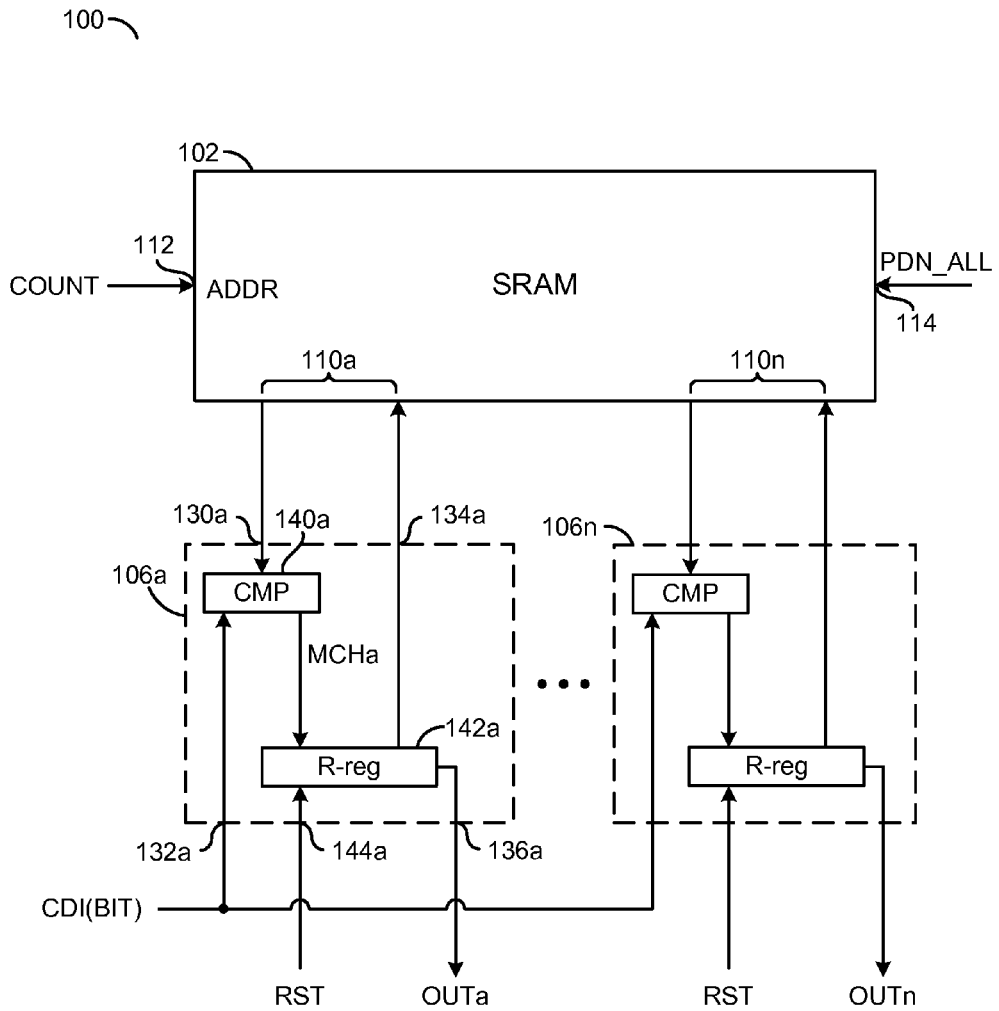
FIG. 2 is a more detailed diagram of the circuit of FIG. 1.

Referring to FIG. 2, a more detailed diagram of the circuit 100 is shown. In particular, additional details of the processing circuits 106a-106n are shown. For example, the processing circuit 106a generally comprises a block (or circuit) 140a and a block (or circuit) 142a. The circuit 140a may be implemented as a compare circuit. The circuit 142a may be implemented as a register circuit. The circuit 106n may comprise a similar configuration as the circuit 106a. The circuit 106a may have an input 144a that may receive a signal (e.g., RST). The signal RST may be a reset signal. The compare circuit 140a may compare a bit received on the input 130a with a bit received on the input 132a. The compare circuit 140a may present an output (e.g., MCHa) to the circuit 142a. The signal MCHa may be a match signal indicating a match has occurred. The circuit 106n may have similar inputs and outputs as the circuit 160a.

Referring to FIG. 3, a table illustrating how words are typically stored in an SRAM is shown. Each address stores a word. For example, bit 0 through bit X−1 of a word D are stored at location 3. The word D is outlined in bold.

Referring to FIG. 4, a table illustrating how each bit of a data word is stored at a different address is shown. In general, the address space Y−1 to 0 of the memory 102 may be equal to the number of bits in the word. Each word is normally stored in one column of the memory 102. For example, a word E is shown with a bold outline in one column. Each address stores one bit from each word. For example, address 3 is outlined in bold and stores bit 3 of each of the words A-F. The particular number of words stored may be varied to meet the design criteria of a particular implementation.

Prior to performing comparisons, the SRAM memory 102 may be loaded in as shown in FIG. 4. A read from a particular address (e.g., address=i) will present bit i for all of words stored in each of the columns.

Figure 5:
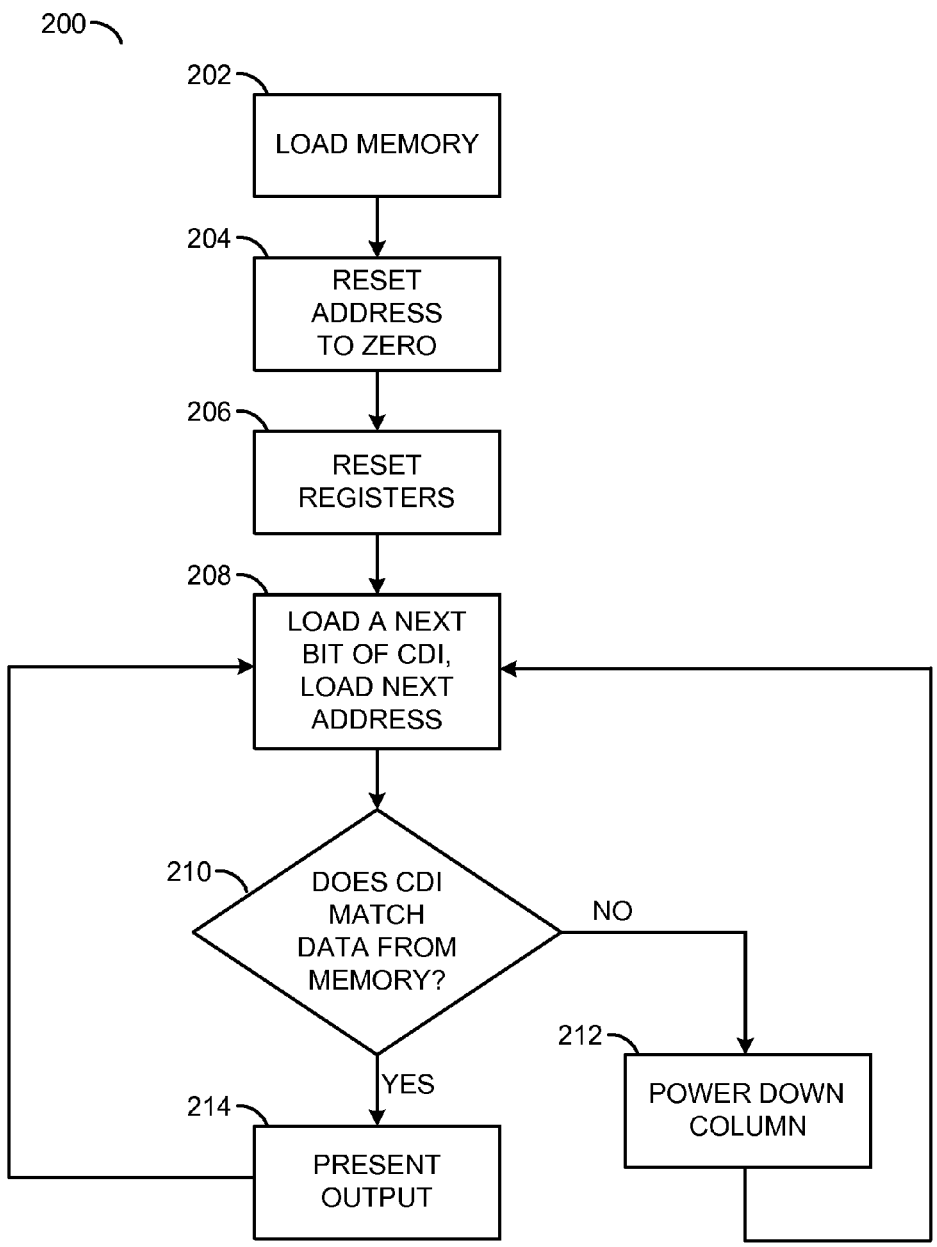
FIG. 5 is a flow diagram of an example operation of the present invention.

Referring to FIG. 5, a flow diagram of a method (or process) 200 illustrating an example operation of the present invention is shown. The method 200 generally comprises a step (or state) 202, a step (or state) 204, a step (or state) 206, a step (or state) 208, a decision step (or state) 210, a step (or state) 212 and a step (or state) 214. The step 202 may load the memory 102. The step 204 may reset the address input 112 to zero. The step 206 may reset the registers 142a-142n. The step 208 may load the next bit of signal CDI and load the next address. The decision state 210 may determine if the signal CDI matches the data read from the address. If so, the method 200 moves to the state 214. The state 214 presents an output, then returns to the state 208. If a match does not occur in the decision state 210, the method 200 moves to the state 212. The state 212 powers down the column the signal CDI was read from. The method 200 then moves back to the state 208.

At the beginning of a comparison, an address may be reset to 0 and all of the registers 142a-142n may be reset. For each comparison cycle, one bit of the compare data word of the signal INPUT may be presented as the signal CDI. The read address may be set to this bit and may follow the following pseudo code:

```
For i=0 to i=Y−1
    Begin
        Set address = i
        Set CDI = CDW[i]
    End
```

For each cycle of the signal CLK, the signal CDI may be compared to each bit read from the memory array 102. For each bit, the comparison results may be stored in the registers 142a-142n. The registers 142a-142n may be implemented as sticky registers. For the sticky registers, if a mismatch occurs, the contents of a particular one of the registers 142a-142n may transition to a mismatch state and remain in the mismatch state until a reset occurs. If one or more of the registers 142a-142n transitions to a mismatch state, a corresponding one of the signal PDNa-PDNn may be asserted. When one of the signals PDNa-PDNn is asserted, the particular input/output 110a-110n for that bit may be placed in a power down state where the dynamic and/or static leakage current is reduced. The power down feature may automatically reduce the consumption of static and/or dynamic leakage current and/or power. At the end of the comparison, any of the output signals OUTa-OUTn that are still in a match state may contain a matching word stored at that bit. In addition to controlling the power down state of the input/outputs 110a-110n, the power down signals PDNa-PDNn may be presented to the OR logic gate 108 to form the memory enable signal PDN_ALL. If all the R-reg bits in the register circuit 142a are a mismatch, the memory 102 will generally be disabled to further reduce power.

In general, the SRAM 102 may be loaded with initial data. The system 100 may then perform several "sets" of compare operations. For example, the system 100 may go through a CDI compare sequence (e.g., 204 through 214) for several CDI words. Some or all of the SRAM 102 may be updated with different words (or columns). The system 100 may then repeat the compare and/or update operations. In one example, the ratio of 2 compares with respect to 3 SRAM updates may be very high. In such an example, the system 100 may be very useful.

Figure 6:
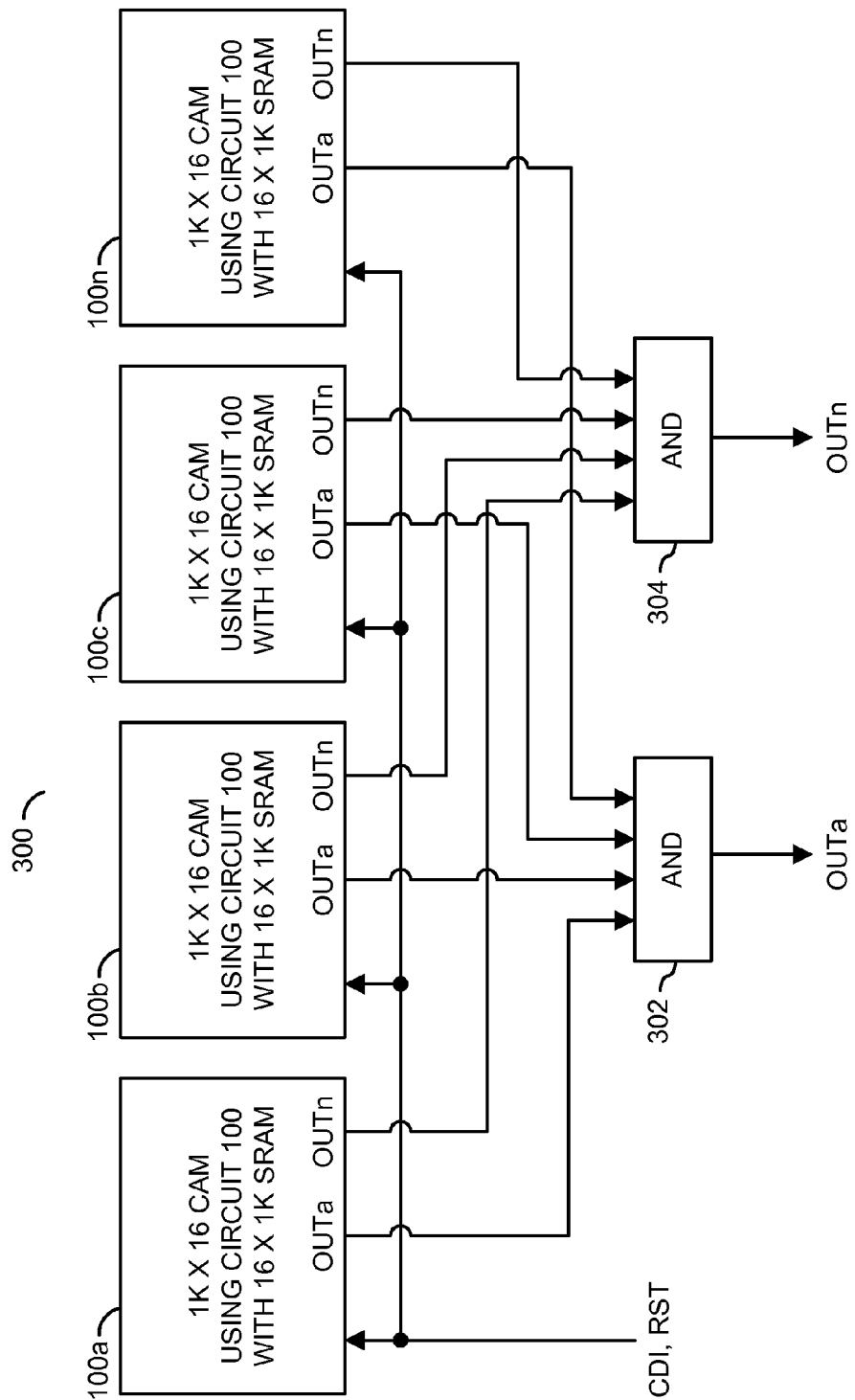
FIG. 6 is a diagram of a system implementing a plurality of memories.

Referring to FIG. 6, an example of a system 300 is shown. The system 300 generally comprises a number of memory circuits 100a-100n, a block (or circuit) 302 and a block (or circuit) 304. The circuit 302 may be implemented as a logic gate circuit. In one example, the circuit 302 may be an AND logic circuit. However, other logic gate circuits may be implemented to meet the design criteria of a particular implementation. The circuit 304 may be implemented as a logic gate circuit. In one example, the circuit 304 may be an AND logic circuit. However, other logic gate circuits may be implemented to meet the design criteria of a particular implementation.

Each of the memory circuits 100a-100n may have an input that may receive the signal CDI and the signal RST, an output that may present the signal OUTa and an output that may present the signal OUTn. The logic gate circuit 302 may receive the signal OUTa from each of the circuits 100a-100n. The logic circuit 304 may receive each of the signals OUTn from each of the circuits 100a-100n. If a 1Kx64 CAM is needed, a maximum of 64 read/compare operations are generally needed to complete the search. To reduce the time needed to complete the 64 read/compare operations, the system 300 may be segmented by subdividing the number of bits into the memories 100a-100n. The output signals OUTa-OUTn for each segment may be logically combined (e.g., an AND operation) together to create the final result. The logic gate circuit 302 may have an output that may present the signal OUTa. Similarly, the logic gate circuit 304 may have an output that may present the signal OUTn. In such an example, the 1Kx64 area may be subdivided into four 1Kx16 memories which results in 16 cycles of the signal CLK to complete the search.

The various signals of the present invention are generally "on" (e.g., a digital HIGH, or 1) or "off" (e.g., a digital LOW, or 0). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

As would be apparent to those skilled in the relevant art(s), the signals illustrated in FIG. 1 represent logical data flows. The logical data flows are generally representative of physical data transferred between the respective blocks by, for example, address, data, and control signals and/or busses. The system represented by the circuit 100 may be implemented in hardware, software or a combination of hardware and software according to the teachings of the present disclosure, as would be apparent to those skilled in the relevant art(s).

The present invention may also be implemented by the preparation of ASICs (application specific integrated circuits), Platform ASICs, FPGAs (field programmable gate arrays), PLDs (programmable logic devices), CPLDs (complex programmable logic device), sea-of-gates, RFICs (radio frequency integrated circuits), ASSPs (application specific standard products), one or more integrated circuits, one or more chips or die arranged as flip-chip modules and/or multi-chip modules or by interconnecting an appropriate network of conventional component circuits, as is described herein, modifications of which will be readily apparent to those skilled in the art(s).

While the invention has been particularly shown and described with reference to the preferred embodiments thereof, it will be understood by those skilled in the art that various changes in form and details may be made without departing from the scope of the invention.

The invention claimed is:

1. An apparatus comprising:
a memory array configured to store a plurality of data bits in a plurality of rows and a plurality of columns, wherein a plurality of data words are stored in a respective plurality of said columns; and
a plurality of processing circuits each configured to compare (i) a test bit of a plurality of bits of an input data word with (ii) a test bit of one of said plurality of columns to determine a match, wherein (a) said compare occurs on a first clock cycle of an input clock signal and (b) each of said plurality of processing circuits is configured to power down a respective column of said memory array if said test bit of said input data word does not match said test bit of said column.

2. The apparatus according to claim 1, wherein said plurality of processing circuits implement a second compare of a second test bit of said plurality of columns to a second test bit of said input data word, wherein said second compare occurs on a second clock cycle of said input clock signal.

3. The apparatus according to claim 2, further comprising a control circuit configured to generate (i) said input clock signal and (ii) said first and second tests bits of said input data word in response to an input signal comprising said input data word.

4. The apparatus according to claim 1, wherein each of said plurality of processing circuits is configured to generate a power down signal in response to said respective compare.

5. The apparatus according to claim 4, further comprising:
a circuit configured to generate a global power down signal in response to a plurality of said power down signals.

6. The apparatus according to claim 1, wherein each of said processing circuits comprises a compare circuit and a register circuit, wherein each of said register circuits stores a respective power down state of a respective column of said memory array.

7. The apparatus according to claim 6, wherein each of said processing circuits further comprises a reset input configured to clear said stored respective power down state.

8. The apparatus according to claim 1, wherein said apparatus is configured to reduce current by powering down one or more of said columns.

9. The apparatus according to claim 8, wherein said current comprises static leakage current.

10. The apparatus according to claim 8, wherein said current comprises dynamic leakage current.

11. The apparatus according to claim 1, wherein said memory array comprises an SRAM.

12. The apparatus according to claim 1, wherein said memory array comprises a low power SRAM.

13. The apparatus according to claim 1, further comprising a plurality of said memory arrays.

14. The apparatus according to claim 1, wherein said apparatus is implemented as one or more integrated circuits.

15. An apparatus comprising:
means for storing a plurality of data bits in a plurality of rows and a plurality of columns, wherein a plurality of data words are stored in a respective plurality of said columns; and
means for comparing (i) a test bit of a plurality of bits of an input data word with (ii) a test bit of one of said plurality of columns to determine a match, wherein said compare (a) occurs on a first clock cycle of an input clock signal and (b) powers down a respective column of a memory array if said test bit of said input data word does not match said test bit of said column.

16. A method for implementing a content addressable memory comprising the steps of:
storing a plurality of data bits in a plurality of rows and a plurality of columns, wherein a plurality of data words are stored in a respective plurality of said columns; and
comparing (i) a test bit of a plurality of bits of an input data word with (ii) a test bit of one of said plurality of columns to determine a match, wherein said compare (a) occurs on a first clock cycle of an input clock signal and (b) powers down a respective column of a memory array if said test bit of said input data word does not match said test bit of said column.

17. The method according to claim 16, wherein said content addressable memory is configured to reduce current by powering down one or more of said columns of said memory array.

18. The method according to claim 17, wherein said current comprises static leakage current.

19. The method according to claim 17, wherein said current comprises dynamic leakage current.

* * * * *